(12) United States Patent
Dong

(10) Patent No.: US 8,575,673 B2
(45) Date of Patent: Nov. 5, 2013

(54) ELECTRICALLY ERASABLE PROGRAMMABLE MEMORY AND ITS MANUFACTURING METHOD

(75) Inventor: Yaoqi Dong, Shanghai (CN)

(73) Assignee: Grace Semiconductor Manufacturing Corporation, Shanghai (CN)

(*) Notice: Subject to any disclaimer, the term of this patent is extended or adjusted under 35 U.S.C. 154(b) by 310 days.

(21) Appl. No.: 13/123,148

(22) PCT Filed: Oct. 13, 2008

(86) PCT No.: PCT/CN2008/001726
§ 371 (c)(1),
(2), (4) Date: Apr. 7, 2011

(87) PCT Pub. No.: WO2010/043068
PCT Pub. Date: Apr. 22, 2010

(65) Prior Publication Data
US 2011/0193156 A1     Aug. 11, 2011

(51) Int. Cl.
*H01L 23/00* (2006.01)
(52) U.S. Cl.
USPC .......................................... 257/314; 257/315
(58) Field of Classification Search
USPC .................................. 257/315, 314
See application file for complete search history.

(56) References Cited

U.S. PATENT DOCUMENTS 6,891,220 B2 * 5/2005 Yeh et al. ...................... 257/314

FOREIGN PATENT DOCUMENTS

| CN | 1453878 A | 11/2003 |
| CN | 1455457 A | 11/2003 |
| KR | 20080007939 A | 1/2008 |

* cited by examiner

*Primary Examiner* — Howard Weiss
*Assistant Examiner* — Steven Rao
(74) *Attorney, Agent, or Firm* — Alleman Hall McCoy Russell & Tuttle LLP

(57) ABSTRACT

The electrically erasable programmable memory and its manufacturing method of the present invention forms above the floating gate the polysilicon spacer regions that are extended from the central part of the source region; the insulating part between the polysilicon spacer region and the floating gate has a smaller thickness to increase the capacitance between the floating gate and the polysilicon spacer region and further increasing the voltage coupled to the floating gate. Therefore, the present invention can effectively increase the coupling capacitance at the drain terminal, and has an advantage of low cost and easy production.

12 Claims, 12 Drawing Sheets

ELECTRICALLY ERASABLE PROGRAMMABLE MEMORY AND ITS MANUFACTURING METHOD

CROSS-REFERENCE TO RELATED APPLICATIONS

The present application is the U.S. National Phase of International (PCT) Application Serial No. PCT/CN2008/001726, filed Oct. 13, 2008, entitled "Electrically Erasable Programmable Memory and its Manufacture Method," which is hereby incorporated by reference in its entirety for all purposes.

TECHNICAL FIELD

This invention relates to the field of semiconductor device manufacturing, particularly to an electrically erasable programmable memory and its manufacturing method.

BACKGROUND

Accompanied by the development of technologies and the increasing demands for data and code memory, electrically erasable programmable memory (EEPROM) is widely used due to its programmable and erasable features. As a type of flash memory, it has witnessed an increasing application in semiconductor field due to its erasing speed and high availability. Normally, a flash memory has a structure of split gate or stacked gate or the combination. Wherein, the split gate structure has more extensive application owing to such advantages as high programming efficiency and prevention of "over erasing". Self-aligned split gate flash memory is a type of split gate flash memories, which can alleviate the difficulty in photolithographic alignment and improve the integration by means of self alignment. It is known as self-aligned split gate flash memory, the structure of which is shown in FIG. 1: it has a control gate 11 and a floating gate 12, a source 13 and a drain 14, a source polysilicon region 15, and an insulation region 16. In this structure, the channel below the control gate 11 and the channel below the floating gate 12 are in series connection. F-N tunneling between the floating gate 12 and the control gate 11 is used for erasing; whereas hot carrier injection at the source terminal serves as the approach for programming. During programming, a high voltage is imposed on the source 13 to produce channeling hot carriers. The overlapped part between the source diffusion region and the floating gate 12 couples a high voltage to the floating gate 12, and thereby generating an electric field from the floating gate 12 toward the channel to attract hot carriers. Therefore, the voltage on the floating gate 12 is of vital importance to the programming efficiency.

Such manufacturing method has been confronted with obvious problems with the reduction in the minimum size. In order to manufacture more flash memory units within the same area, the minimum size for photolithography and the dimension of elements shall be further reduced with development of technologies; whereas the length of the floating gate shall be shortened accordingly. Furthermore, the size of the source diffusion region shall also be reduced to prevent the channel below the floating gate from breakdown. As a result, the voltage coupled from the source terminal to the floating gate is decreased, and the programming efficiency is reduced. Moreover, accompanied by reduced size of the source polysilicon, the resistance of the source polysilicon wire is increased, and the reading current of the memory unit is reduced.

To keep the programming efficiency, one method is to add a second control gate above the floating gate. This kind of structure as shown in FIG. 2 is called a self-aligned tri-gate split gate flash memory, which comprises a first control gate 21 and a floating gate 22, a source 23 and a drain 24, a source polysilicon region 25 and an insulation region 26; furthermore, a second control gate 27 is formed above the floating gate 22. During programming, a high voltage is imposed on the second control gate 27 to increase the voltage on the floating gate 22. However, such method may result in increased complexity in circuit design and manufacturing process, as well as increased manufacturing cost.

SUMMARY OF THE INVENTION

The present invention aims to provide an electrically erasable programmable memory and its manufacturing method, which has an advantage of low cost and easy production. Meanwhile, it can also effectively increase the coupling capacitance at the source terminal.

To achieve the above object, the present invention provides an electrically erasable programmable memory, which comprises:

a semiconductor substrate having a first conductivity type;

first and second regions having a second conductivity type, wherein the first region and the second regions are formed in the semiconductor substrate with a certain space left therebetween, and a channel region is formed between the first region and the second region;

conductive floating gates, formed above and vertically covering part of the channel region and part of the first region, the floating gates being insulated from the channel regions and the first region;

a conductive source region, electrically connecting to the first region of the semiconductor substrate, wherein a lower part of the source region is located above the first region, lateral sides of the lower part of the source region being adjacent to and insulated from the floating gates; a central part of the source region is extended in both sides to above the floating gates and is insulated from the floating gates; the width of an upper part of the source region is smaller than the width of the central part of the source region;

conductive control gates, a lower part of the control gate being adjacent to and insulated from the floating gate, an upper part of the control gate being adjacent to and insulated from the central part and upper part of the source region;

wherein, the insulating material between the central part of the source region and the floating gate has a predetermined thickness to facilitate the voltage coupling between the central part of the source region and the floating gate.

Furthermore, the thickness of the insulating material between the central part of the source region and the floating gate is 1 nm-100 nm.

Furthermore, the insulating material between the central part of the source region and the floating gate is composed of a first insulating silicon oxide layer, an insulating silicon nitride layer and a second insulating silicon oxide layer.

Furthermore, the insulating material between the upper part of the control gate and the central part of the source region is composed of a second insulating silicon oxide layer, an insulating silicon nitride layer and a tunneling medium layer.

Furthermore, the insulating material between the upper part of the control gate and the upper part of the source region is composed of an insulating silicon oxide spacer, an insulating silicon nitride layer and a tunneling medium layer.

To achieve the above object, the present invention further provides a method for manufacturing an electrically erasable programmable memory, which comprises the following steps:

(a) forming in sequence an insulating layer, a first polysilicon layer and a first silicon nitride layer on a semiconductor substrate;

(b) forming a groove in the above structure by anisotropic etch of silicon nitride, and exposing the first polysilicon layer at the bottom of the groove;

(c) depositing in sequence a dielectric layer and a second polysilicon layer on the above structure;

(d) etching the second polysilicon layer by anisotropic etch of polysilicon, and forming first polysilicon spacers in the groove;

(e) etching the dielectric layer and the first polysilicon layer exposed between the first polysilicon spacers to expose the insulating layer, and forming a heavily doped source by source ion implantation;

(f) depositing a first silicon oxide layer and forming silicon oxide spacers between the first polysilicon layers and on the first polysilicon spacers by anisotropic etch of silicon oxide, wherein the silicon oxide spacers are divided into two parts, an upper part being connected to the first polysilicon spacers and the sidewalls of the first silicon nitride layers, a lower part of the silicon oxide spacers being connected to the semiconductor substrate and the first polysilicon spacers and being in contact with the first polysilicon layers at both sides of the groove;

(g) depositing a third polysilicon layer which forms good electric contact with the first polysilicon spacers to form a source polysilicon;

(h) removing the third polysilicon layer above the first silicon oxide layer and meanwhile reducing the height of the third polysilicon layer inside the groove to be higher than the first polysilicon spacers and lower than the silicon oxide spacers on the first polysilicon spacers by chemical mechanical polishing to form a source polysilicon region;

(i) forming a second silicon oxide layer on the surface of the source polysilicon region;

(j) removing in sequence the first silicon nitride layer as well as the first polysilicon layer and the insulating layer exposed successively, and exposing the semiconductor substrate;

(k) forming a third silicon oxide layer on the above structure as a tunneling medium layer and depositing a fourth polysilicon layer on the third silicon oxide layer;

(l) forming second polysilicon spacers by anisotropic etch of polysilicon;

(m) forming heavily doped drains by drain ion implantation;

(n) successively forming metallic silicides and proceeding with standard backend process to form interconnections.

Furthermore, the insulating layer in step (a) is a silicon dioxide layer.

Furthermore, step (l) is followed by step (l-1): performing lightly doped drain ion implantation, and depositing a fourth silicon oxide layer and a second silicon nitride layer, and forming silicon nitride spacers by anisotropic etch.

Furthermore, an etching stop layer is formed between the first polysilicon layer and the first silicon nitride layer.

Furthermore, the etching stop layer is a silicon oxide layer.

Furthermore, the dielectric layer in step (c) is composed of a fifth silicon oxide layer, a third silicon nitride layer and a sixth silicon oxide layer.

Furthermore, the second silicon oxide layer in step (h) is formed by oxidation or by the combination of deposition and chemical mechanical polishing.

The electrically erasable programmable memory and its manufacturing method of the present invention forms above the floating gate the polysilicon spacer regions that are extended from the central part of the source region; the insulating part between the polysilicon spacer region and the floating gate has a smaller thickness to increase the capacitance between the floating gate and the polysilicon spacer region and further increasing the voltage coupled to the floating gate. Therefore, the present invention can effectively increase the coupling capacitance at the drain terminal, and has an advantage of low cost and easy production.

DETAILED DESCRIPTION OF THE INVENTION

Figure 1:
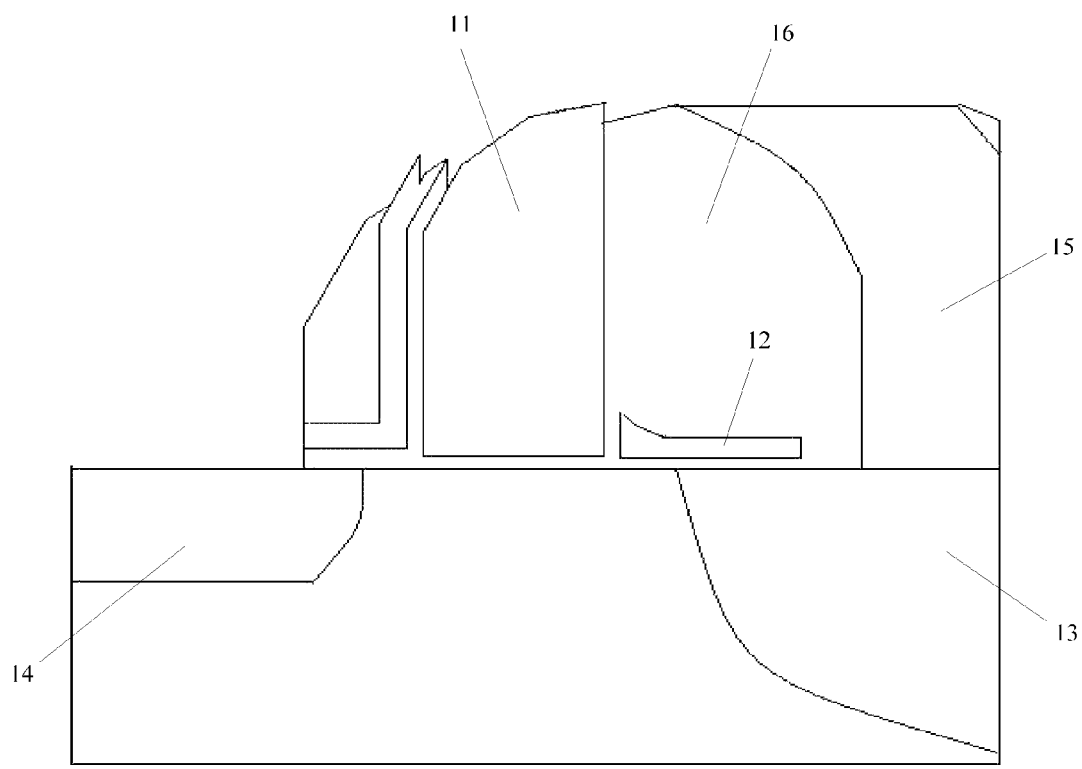
FIG. 1 is a schematic view of the structure of a self-aligned split gate flash memory of the prior art.
Figure 2:
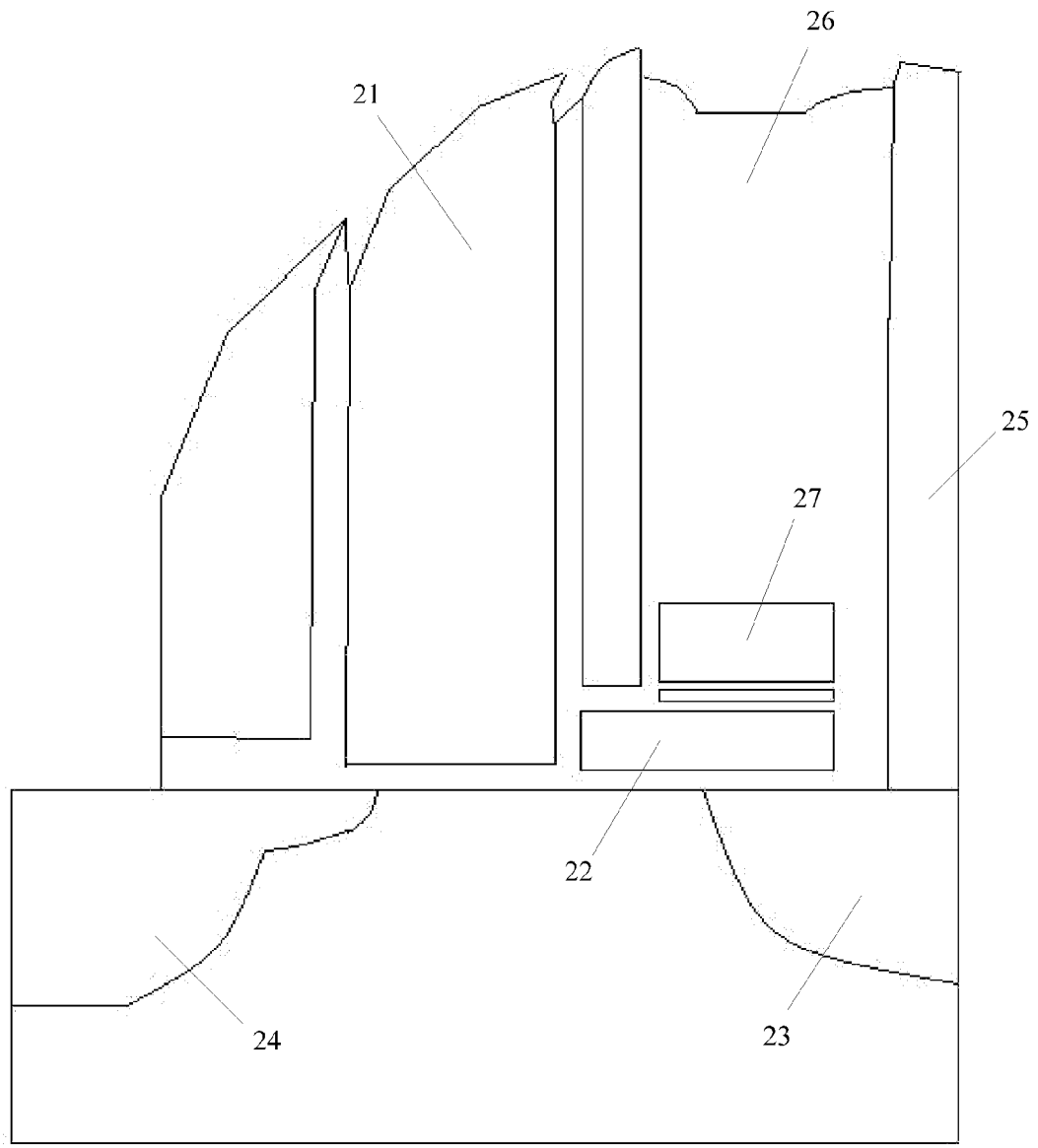
FIG. 2 is a schematic view of the structure of a self-aligned tri-gate split gate flash memory of the prior art.
Figure 3:
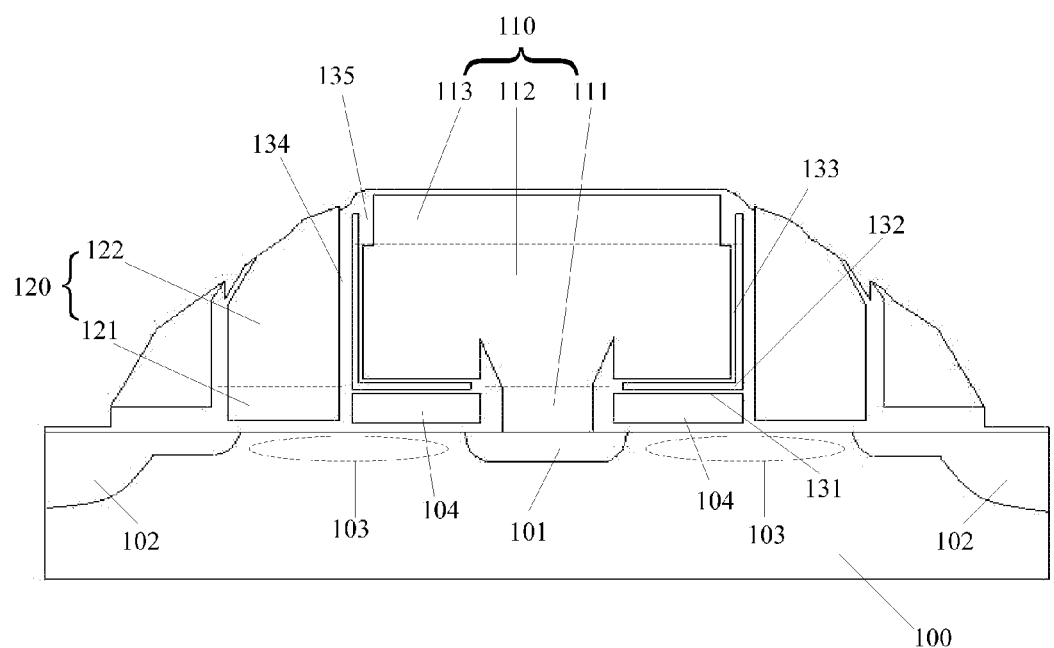
FIG. 3 is a schematic view of the structure of the self-aligned split gate flash memory according to one preferred embodiment of the present invention.

Preferred embodiments and description of the drawings for better understanding of the technical contents of the present invention are stated as follows:

As the electrically erasable programmable memory is in a symmetrical structure, one side for description of the device components and their positions is provided. Please refer to FIG. 3, which is a schematic view of the structure of the self-aligned split gate flash memory according to one preferred embodiment of the present invention. The present invention provides an electrically erasable programmable memory, which comprises: a semiconductor substrate 100 having a first conductivity type; a first region 101 and a second region 102 having a second conductivity type, wherein the first region 101 and the second region 102 are formed in the semiconductor substrate 100 with a certain space left therebetween, and there is a channel region 103 between the first region 101 and the second region 102; a conductive floating gate 104, formed above and vertically covering part of the channel region 103 and part of the first region 101, the floating gate 104 being insulated from the channel region 103 and the first region 101; a conductive source polysilicon region 110, electrically connecting to the first region 101 of the semiconductor substrate 100, wherein the source region 110 comprises lower, central and upper parts 111-113, the lower part 111 of the source region being located above the first region 101, one side of the lower part 111 of the source region being adjacent to and insulated from the floating gate 104, the central part 112 of the source region being extended in both sides to above the floating gate 104 and being insulated from the floating gate 104, the width of the upper part of the source region 113 being smaller than that of the central part 112 of the source region; a conductive control gate 120, wherein the lower part 121 of the conductive control gate is adjacent to and insulated from the floating gate 104, and the upper part 122 of the control gate is adjacent to and insulated from the central part 112 and upper part 113 of the source region. The thickness of the insulating material between the central part 112 of the source region and the floating gate 104 can be predetermined to facilitate the voltage coupling between the central part 112 of the source region and the floating gate 104, because the central part 112 of the source region is extended in both sides to above the floating gate 104, and the space between the central part 112 and the floating gate 104 is controllable; it is possible to determine the thickness when depositing the insulating material.

According to one preferred embodiment of the present invention, the thickness of the insulating material between the central part 112 of the source region and the floating gate 104 is 1 nm-100 nm. The insulating material between the central part 112 of the source region and the floating gate 104 is composed of a first insulating silicon oxide layer 131, an insulating silicon nitride layer 132 and a second insulating silicon oxide layer 133, namely forming an ONO structure. On one hand, this ensures the physical thickness of the insulating medium layer to minimize the electric leakage between the floating gate 104 and the polysilicon spacer of the central part 112 of the source region; on the other hand, this minimizes the electric thickness of the insulating medium layer to increase the capacitance between the floating gate 104 and the polysilicon spacer of the central part 112 of the source region, and thereby increasing the voltage coupled to the floating gate 104.

Meanwhile, the insulating material between the upper part 122 of the control gate and the central part 112 of the source region is composed of the second insulating silicon oxide layer 133, the insulating silicon nitride layer 132 and a tunneling medium layer 134. The insulating material between the upper part 122 of the control gate and the upper part 113 of the source region is composed of an insulating silicon oxide spacer 135, the insulating silicon nitride layer 132 and the tunneling medium layer 134. The ONO structure of the insulating medium layer can ensure its physical thickness and provide a good insulation.

Figure 4:
FIGS. 4-20 are schematic views of the manufacturing process of the self-aligned split gate flash memory according to one preferred embodiment of the present invention.
Figure 5:
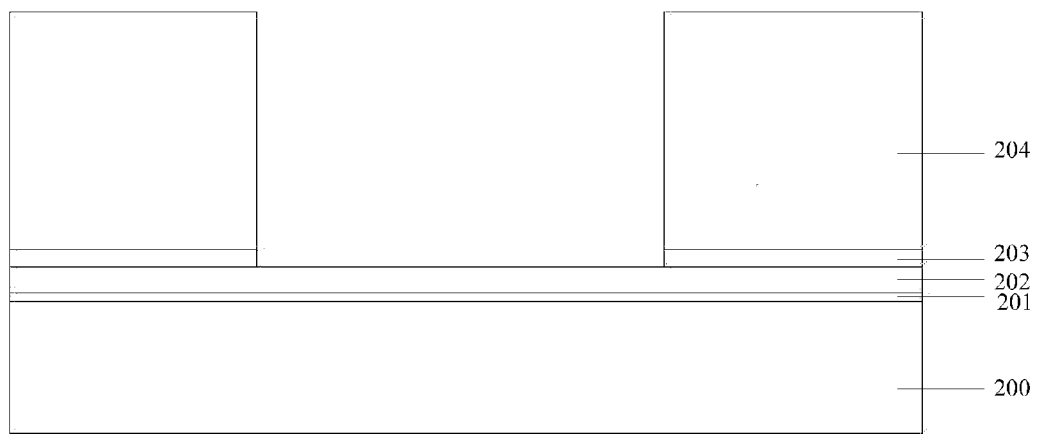
Figure 6:
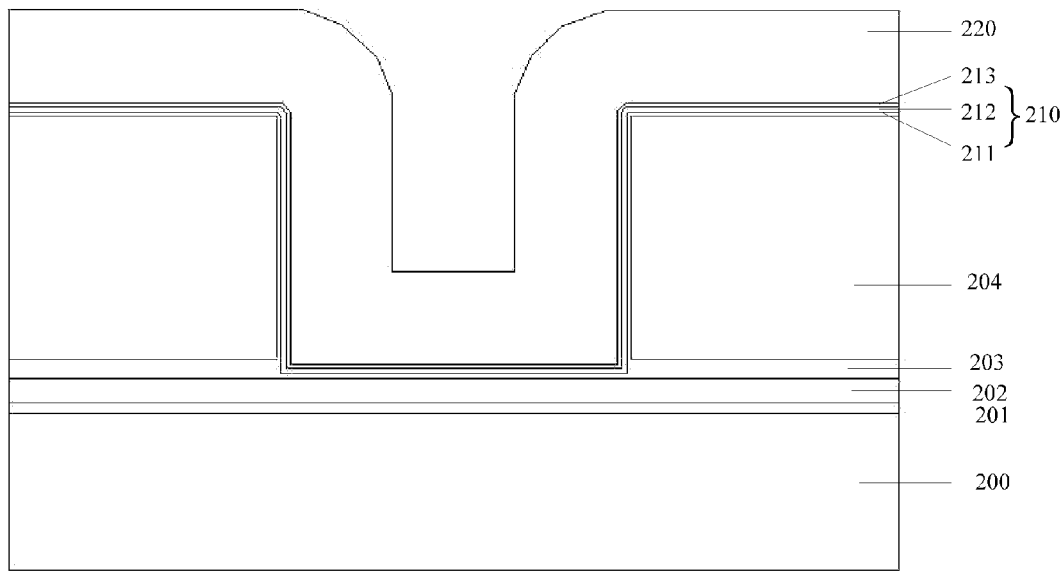
Figure 7:
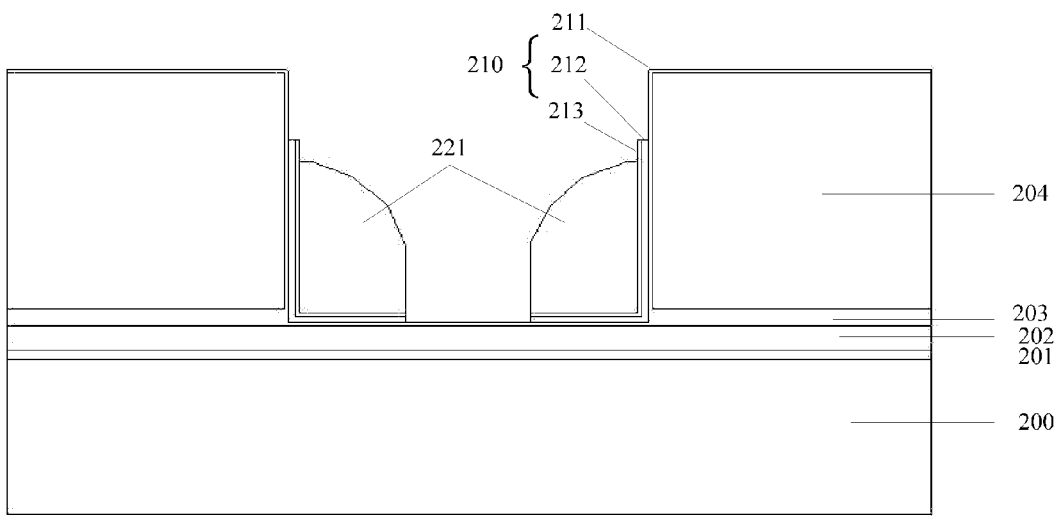
Figure 8:
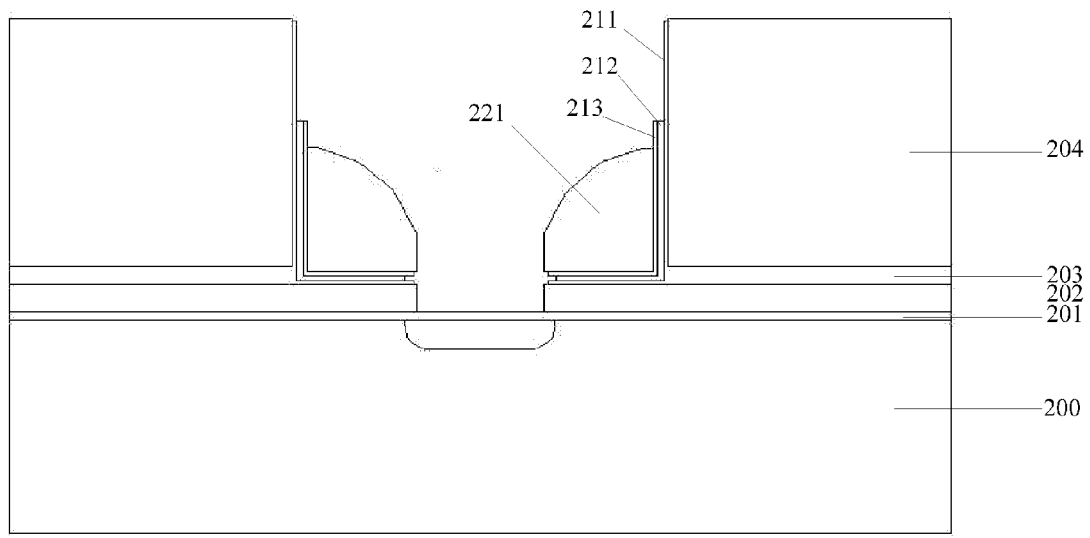
Figure 9:
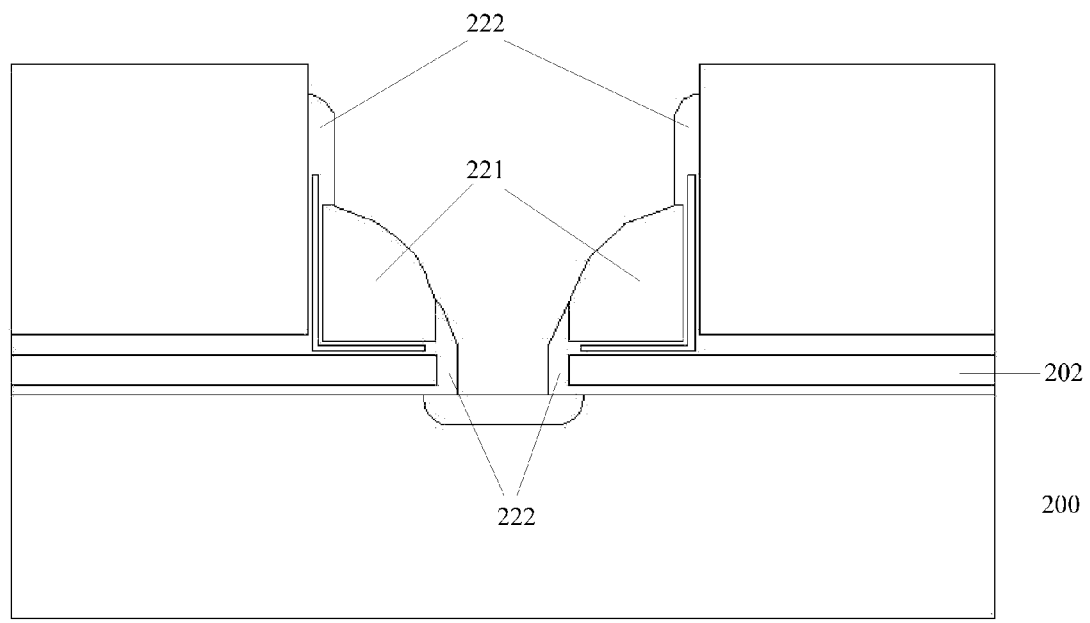
Figure 10:
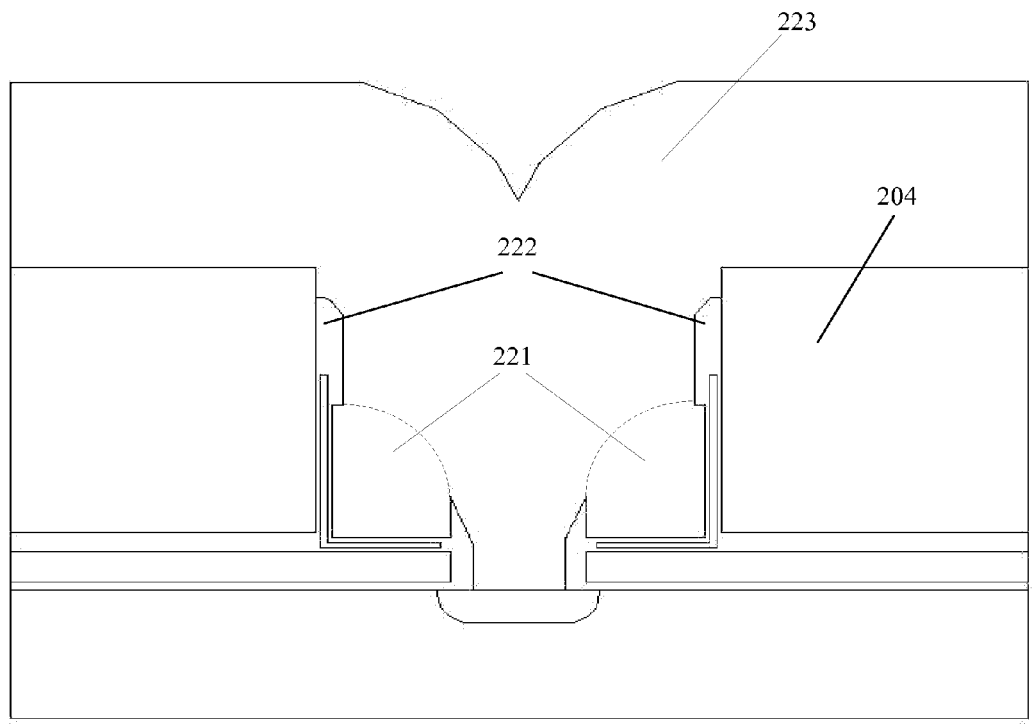
Figure 11:
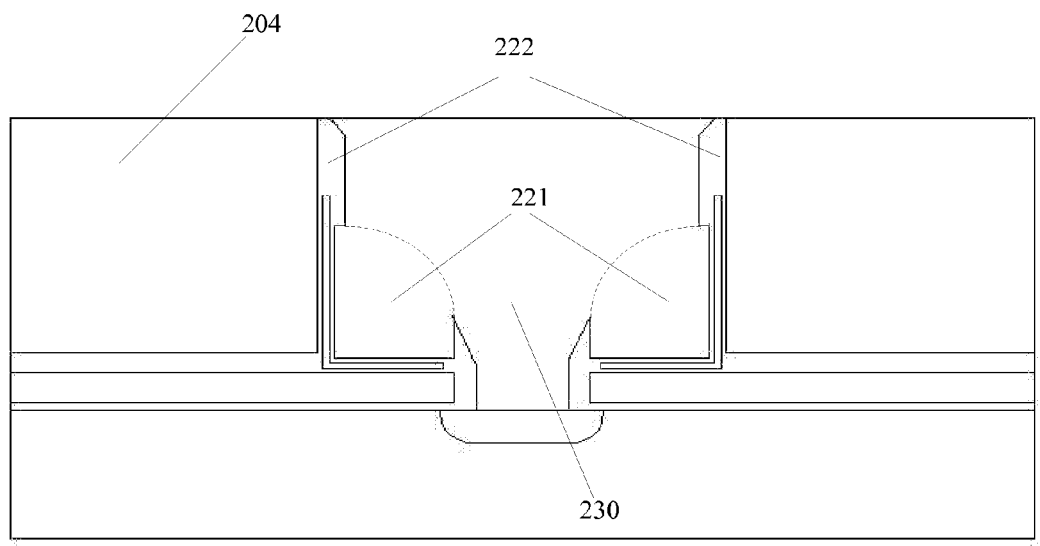
Figure 12:
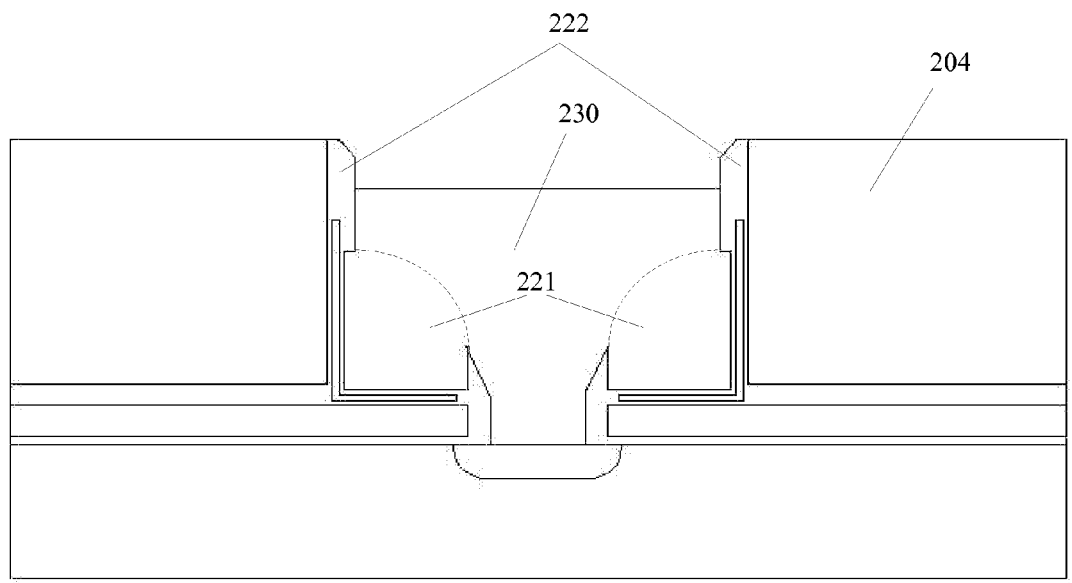
Figure 13:
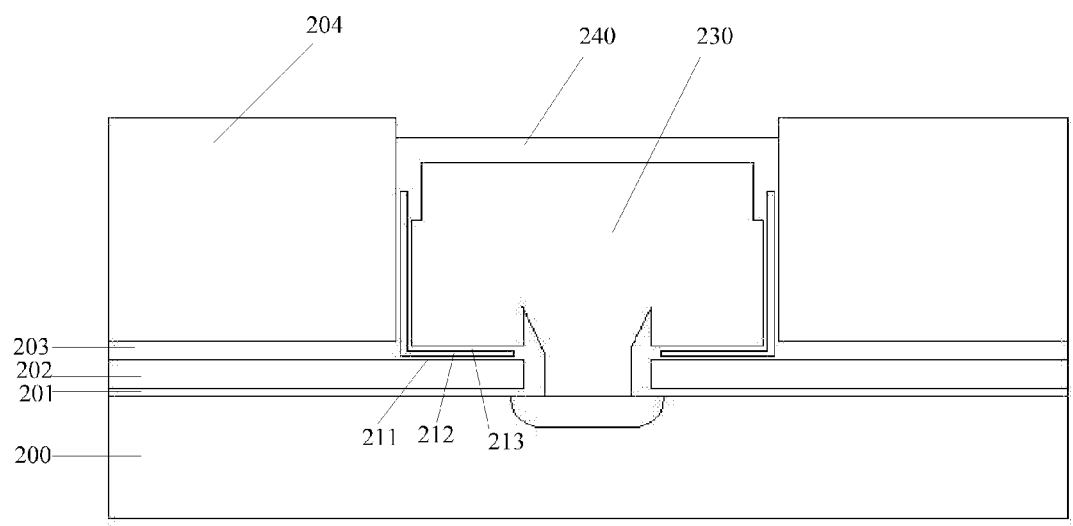
Figure 14:
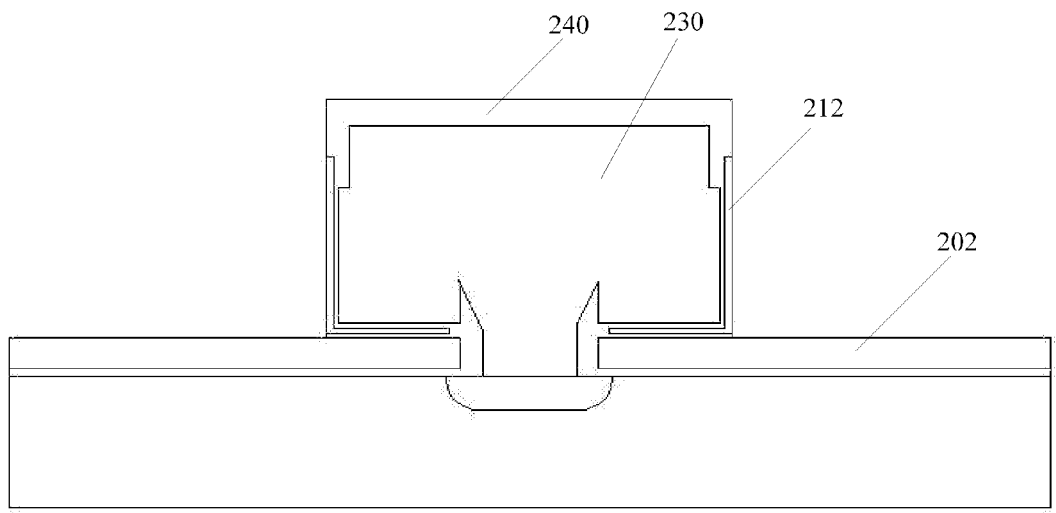
Figure 15:
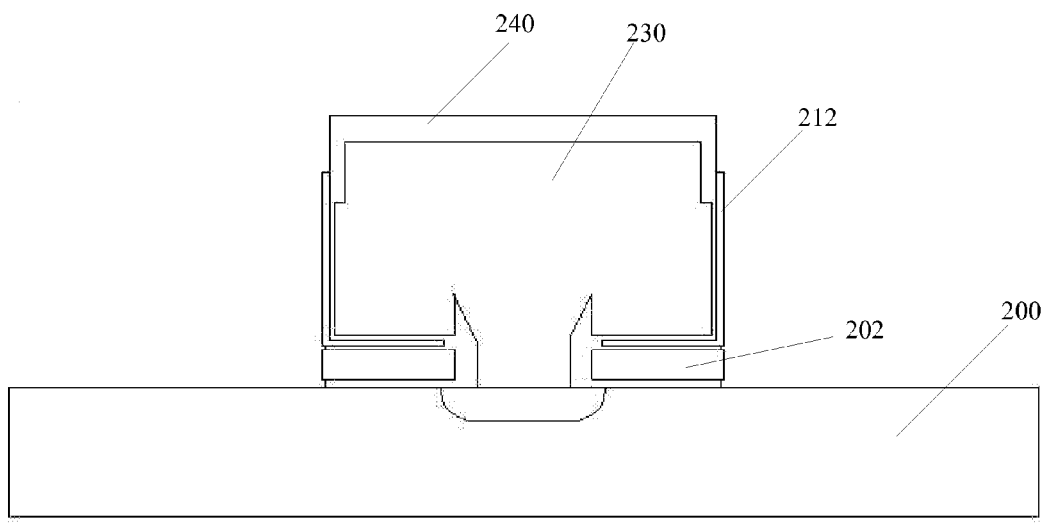
Figure 16:
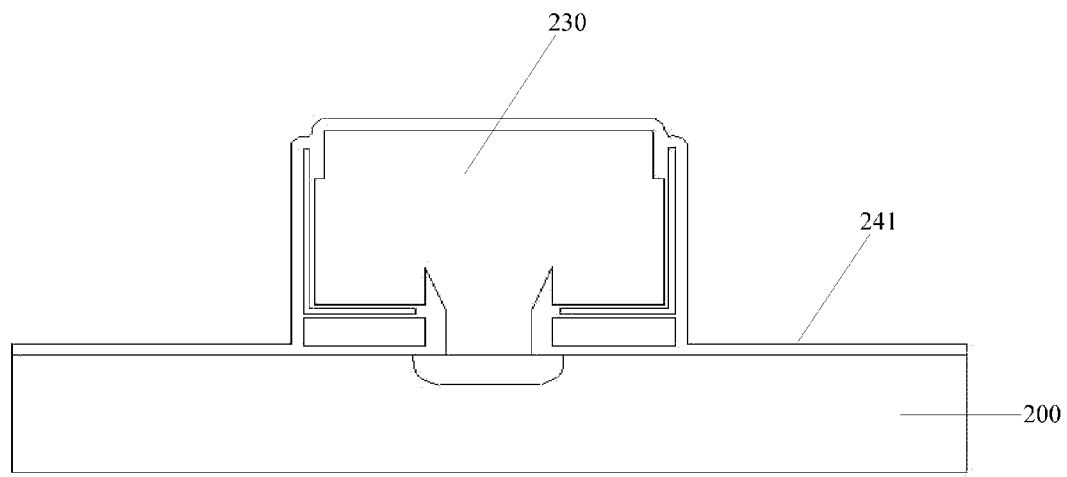

Please refer to FIGS. 4-20, FIGS. 4-20 show structural views of the manufacturing process of the self-aligned split gate flash memory according to one preferred embodiment of the present invention. The present invention further provides a method for manufacturing an electrically erasable programmable memory, which comprises the following steps:

First of all, form in sequence an insulating layer 201, a first polysilicon layer 202 and a first silicon nitride layer 204 on the semiconductor substrate 200. According to one preferred embodiment of the present invention, an etching stop layer 203 is formed between the first polysilicon layer 202 and the first silicon nitride layer 204. The manufacturing process includes first growing an insulating layer 201 (for instance, silicon oxide) on the semiconductor substrate 200 by thermal oxidation or deposition; then depositing in sequence a floating gate polysilicon layer as the first polysilicon layer 202, an optional silicon oxide layer as the etching stop layer 203 (used as the stop layer for silicon nitride etch to prevent the decrease in the thickness of the polysilicon due to the silicon nitride etch in the next step), and the first silicon nitride layer 204;

Then form a groove in the structure as shown in FIG. 4 by anisotropic etch of silicon nitride, wherein the etch stops at the stop layer 203. And then, remove the exposed stop layer 203 by means of wet etch to expose the first polysilicon layer 202 at the bottom of the groove (see FIG. 5);

Afterwards, as shown in FIG. 6, deposit in sequence a dielectric layer 210 and a second polysilicon layer 220, wherein the dielectric layer 210 is composed of a fifth silicon oxide layer 211, a third silicon nitride layer 212 and a sixth silicon oxide layer 213 to form an ONO structure; on one hand, this ensures the physical thickness of the dielectric layer 210 to minimize the electric leakage between the floating gate eventually formed and the polysilicon spacer 221 to be formed; on the other hand, this minimizes the electric thickness of the dielectric layer 210 (normally, the electric thickness is represented by the thickness of equivalent oxide) to increase the capacitance between the floating gate eventually formed and the polysilicon spacer 221 to be formed, and thereby increasing the voltage coupled to the floating gate;

Then etch the second polysilicon layer 220 by anisotropic polysilicon etch and appropriate over-etch to form first polysilicon spacers 221 in the groove; and then remove a part of the sixth silicon oxide layer 213 and a part of the third silicon nitride layer 212 of the ONO layer on a horizontal surface and at lateral sides that are not covered by the first polysilicon spacers 221 by anisotropic etch of silicon oxide and silicon nitride (as shown in FIG. 7);

After that, etch the insulating layer exposed between the first polysilicon spacers 221, namely remove the part of the fifth silicon oxide layer 211 of the ONO structure exposed on the plane surface and the first polysilicon layer 202 below the fifth silicon oxide layer 211 respectively by anisotropic etch of silicon oxide and polysilicon to expose the insulating layer 201, and meanwhile, the height of the first polysilicon spacers 221 are reduced. After that, proceed with source ion implantation to form heavily doped source (as shown in FIG. 8);

Then deposit a first silicon oxide layer (not indicated in the drawings) and form silicon oxide spacers 222 (see FIG. 9) between the first polysilicon layers 202 and on the first polysilicon spacers 221 by anisotropic etch of silicon oxide. The silicon oxide spacers 222 are divided into two parts; the upper part is respectively connected to the first polysilicon spacers 221 and the side walls of the first silicon nitride layer 204, which forms an integral part with the fifth silicon oxide layer 211 above the first silicon nitride layer 204; the lower part of the silicon oxide spacer 222 is connected to the semiconductor substrate 200 and the first polysilicon spacers 221, and is also in connection with the first polysilicon layers 202 on both sides;

Deposit a third polysilicon layer 223, which should be in a good electric contact with the first polysilicon spacers 221 to form the source polysilicon (see FIG. 10);

Afterwards, remove the part of the third polysilicon layer 223 that is above the first silicon nitride layer 204 (see FIG. 11) by chemical mechanical polishing, and meanwhile reduce the height of the third polysilicon layer 223 inside the groove to make it higher than the first polysilicon spacers 221 and lower than the silicon oxide spacers 222 on the first polysilicon spacers to form the source polysilicon region 230 (as shown in FIG. 12);

Then as shown in FIG. 13, form a second silicon oxide layer 240 on the surface of the source polysilicon region 230. The second silicon oxide layer 240 is formed by oxidation or by the combination of deposition and chemical mechanical polishing.

After that, remove the first silicon nitride layers 204, during which process, the fifth silicon oxide layer 211 in the ONO structure is used to protect the third silicon nitride layer 212 in the ONO structure. Then remove the stop layer 203 below as well as the fifth silicon oxide layer 211 of the ONO structure; a part of the second silicon oxide layer 240 is also removed (see FIG. 14). During this process, the middle third silicon nitride layer 212 is used to protect the sixth silicon oxide layer 213.

After that, remove the exposed part of the first polysilicon layer 202 by anisotropic dry etch of polysilicon, during which process, the second silicon oxide layer 240 above the source polysilicon region 230 is used to protect the source polysilicon region 230. Then remove the insulating layer 201 by silicon oxide etch to expose the semiconductor substrate 200 (see FIG. 15).

Figure 17:
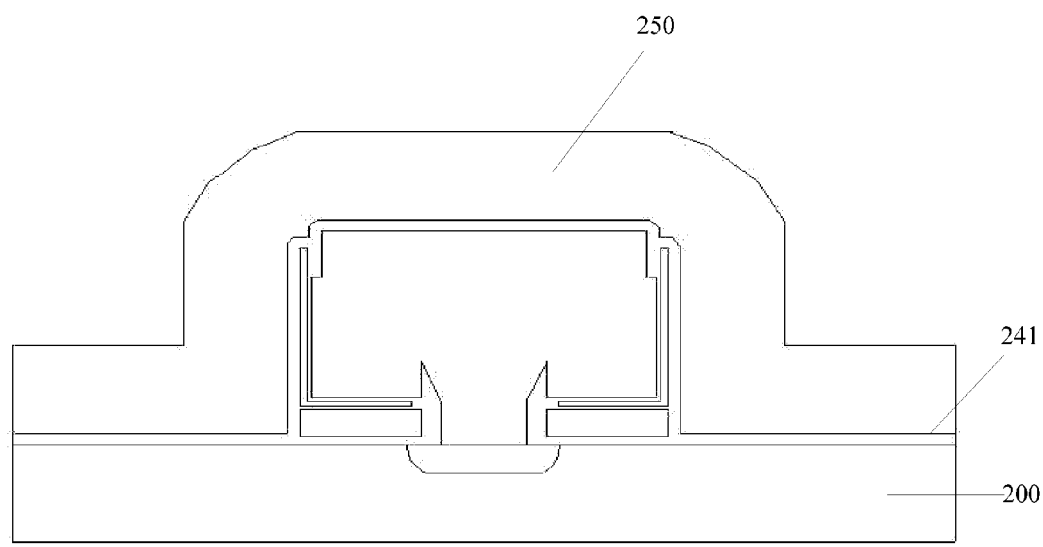
Figure 18:
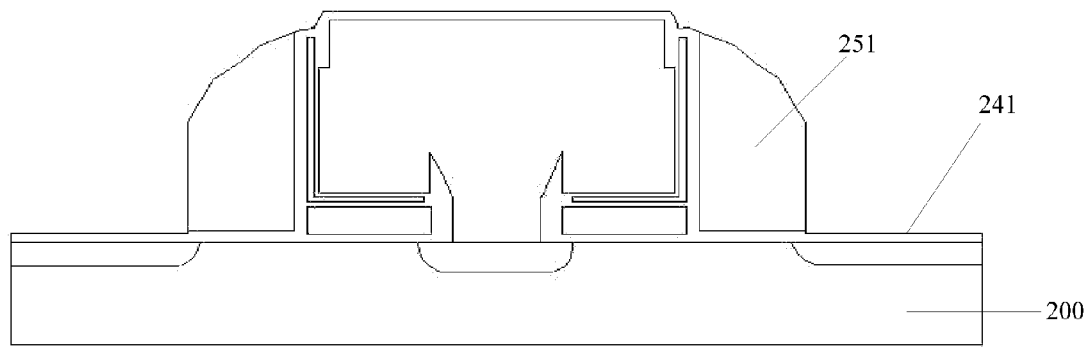

After that, deposit on the above structure a layer of silicon oxide, which covers the second silicon oxide layer 240 and forms a third silicon oxide layer 241 to be used as the tunneling medium layer (see FIG. 16), and further deposit a fourth polysilicon layer 250 on the third silicon oxide layer 241 (see FIG. 17).

Figure 19:
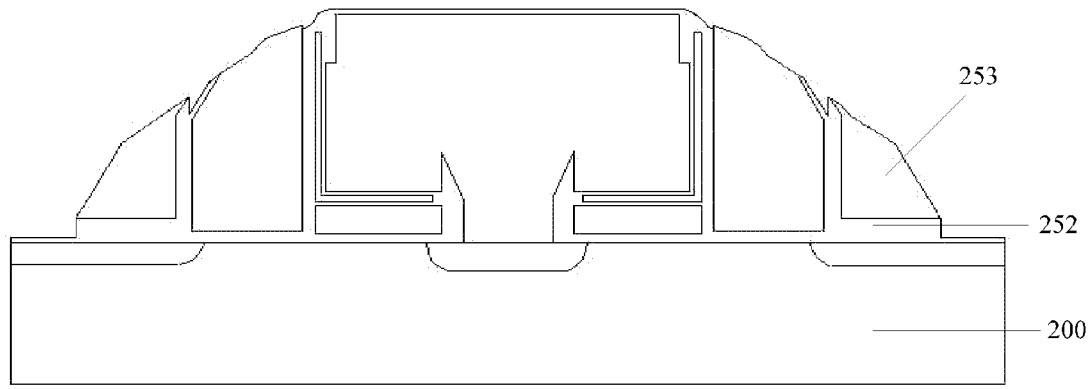

Then form second polysilicon spacers 251 by anisotropic etch of polysilicon (see FIG. 18); perform lightly doped drain ion implantation; further deposit a fourth silicon oxide layer 252 and a second silicon nitride layer, and proceed with anisotropic etch to form silicon nitride spacers 253 (see FIG. 19).

Figure 20:
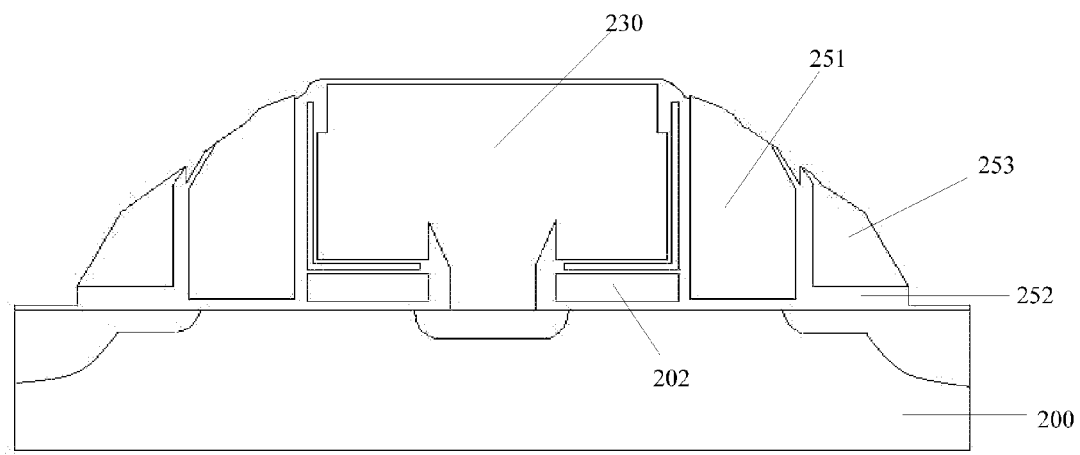

Further proceed with drain ion implantation to form heavily doped drain (see FIG. 20).

Finally, sequentially form metallic silicides and perform standard backend process to form interconnections.

The multiple layers of polysilicon layer and the polysilicon spacers according to the preferred embodiments of the present invention are made of the same polysilicon material; the multiple layers of silicon oxide layer and the silicon oxide spacers are made of the same silicon oxide material; whereas the multiple layers of silicon nitride layer and the silicon nitride spacers are made of the same silicon nitride material.

The electrically erasable programmable memory and its method according to the present invention forms above the floating gate the polysilicon spacer regions that are extended from the central part of the source region; the insulating part between the polysilicon spacer region and the floating gate has a smaller thickness to increase the capacitance between the floating gate and the polysilicon spacer region and further increasing the voltage coupled to the floating gate. Therefore, the present invention has an advantage of low cost and easy production, which can also effectively increase the coupling capacitance at the drain terminal.

Despite of disclosure by foregoing preferred embodiments, the present invention is not limited thereby. Any person with common knowledge in the field of the invention can make any alteration and modification not deviated from the spirit and scope of the invention. Therefore, protection scope of the invention shall be as per that as specified by the claims.

What is claimed is:

1. An electrically erasable programmable memory, comprising:
a semiconductor substrate having a first conductivity type;
a first region and a second region having a second conductivity type, the first region and the second region being formed beneath a surface of the semiconductor substrate with a certain space left therebetween, a planar channel region being formed between the first region and the second region;
a conductive floating gate formed above the surface of the semiconductor substrate and vertically covering a part of the planar channel region and a part of the first region, the floating gate being insulated from the planar channel region and the first region;
a conductive source region formed above the surface of the semiconductor substrate and electrically connecting to the first region of the semiconductor substrate, a lower part of the source region being located above the first region, a lateral side of the lower part of the source region being adjacent to and insulated from the floating gate, a central part of the source region being extended in both sides to above the floating gate and being insulated from the floating gate, an upper part of the source region having a smaller width than the central part of the source region;
a conductive control gate formed above the surface of the semiconductor substrate, a lower part of the control gate being adjacent to and insulated from the floating gate, an upper part of the control gate being adjacent to and insulated from the central part and the upper part of the source region;
wherein, insulating material between the central part of the source region and the floating gate has a predetermined thickness to facilitate a voltage coupling between the central part of the source region and the floating gate.

2. The electrically erasable programmable memory according to claim 1, characterized in that the thickness of the insulating material between the central part of the source region and the floating gate is 1 nm-100 nm.

3. The electrically erasable programmable memory according to claim 1, characterized in that the insulating material between the central part of the source region and the floating gate is composed of a first insulating silicon oxide layer, an insulating silicon nitride layer and a second insulating silicon oxide layer.

4. The electrically erasable programmable memory according to claim 1, characterized in that the insulating material between the upper part of the control gate and the central part of the source region is composed of a second insulating silicon oxide layer, an insulating silicon nitride layer and a tunneling medium layer.

5. The electrically erasable programmable memory according to claim 1, characterized in that the insulating material between the upper part of the control gate and the upper part of the source region is composed of an insulating silicon oxide spacer, an insulating silicon nitride layer and a tunneling medium layer.

6. A method for manufacturing an electrically erasable programmable memory, comprising the following steps in the sequence set forth:
(a) forming in sequence an insulating layer, a first polysilicon layer and a first silicon nitride layer on a semiconductor substrate;
(b) forming a groove in the above structure by anisotropic etch of silicon nitride, and exposing the first polysilicon layer at a bottom of the groove;
(c) depositing in sequence a dielectric layer and a second polysilicon layer on the above structure;
(d) etching the second polysilicon layer by anisotropic etch of polysilicon, and forming first polysilicon spacers in the groove;
(e) etching the dielectric layer and the first polysilicon layer exposed between the first polysilicon spacers to expose the insulating layer, and forming a heavily doped source by source ion implantation;
(f) depositing a first silicon oxide layer and forming silicon oxide spacers between the first polysilicon layer and on the first polysilicon spacers by anisotropic etch of silicon oxide, the silicon oxide spacers being divided into two parts, an upper part being connected to the first polysilicon spacers and sidewalls of the first silicon nitride layer, a lower part of the silicon oxide spacers being connected to the semiconductor substrate and the first polysilicon spacers and being in contact with the first polysilicon layer at both sides of the groove;
(g) depositing a third polysilicon layer which forms good electric contact with the first polysilicon spacers to form a source polysilicon;

(h) removing the third polysilicon layer above the first silicon oxide layer and meanwhile reducing a height of the third polysilicon layer inside the groove to be higher than the first polysilicon spacers and lower than the silicon oxide spacers on the first polysilicon spacers by chemical mechanical polishing to form a source polysilicon region;

(i) forming a second silicon oxide layer on a surface of the source polysilicon region;

(j) removing in sequence the first silicon nitride layer as well as the first polysilicon layer and the insulating layer exposed successively, and exposing the semiconductor substrate;

(k) forming a third silicon oxide layer on the above structure as a tunneling medium layer and depositing a fourth polysilicon layer on the third silicon oxide layer;

(l) forming second polysilicon spacers by anisotropic etch of polysilicon;

(m) forming heavily doped drains by drain ion implantation;

(n) forming metallic silicides and proceeding with standard backend process to form interconnections.

7. The method for manufacturing an electrically erasable programmable memory according to claim 6, characterized in that the insulating layer in step (a) is a silicon dioxide layer.

8. The method for manufacturing an electrically erasable programmable memory according to claim 6, characterized in that step (l) is followed by step (l-1): performing lightly doped drain ion implantation, and depositing a fourth silicon oxide layer and a second silicon nitride layer, and forming silicon nitride spacers by anisotropic etch.

9. The method for manufacturing an electrically erasable programmable memory according to claim 6, characterized in that an etching stop layer is formed between the first polysilicon layer and the first silicon nitride layer.

10. The method for manufacturing an electrically erasable programmable memory according to claim 9, characterized in that the etching stop layer is a silicon oxide layer.

11. The method for manufacturing an electrically erasable programmable memory according to claim 6, characterized in that the dielectric layer in step (c) is composed of a fifth silicon oxide layer, a third silicon nitride layer and a sixth silicon oxide layer.

12. The method for manufacturing an electrically erasable programmable memory according to claim 6, characterized in that the second silicon oxide layer in step (i) is formed by oxidation or by a combination of deposition and chemical mechanical polishing.

\* \* \* \* \*